(12) United States Patent
Flynn et al.

(10) Patent No.: US 8,417,774 B2
(45) Date of Patent: Apr. 9, 2013

(54) APPARATUS, SYSTEM, AND METHOD FOR A RECONFIGURABLE BASEBOARD MANAGEMENT CONTROLLER

(75) Inventors: David Flynn, Sandy, UT (US); John Strasser, Syracuse, UT (US); Jonathan Thatcher, Lehi, UT (US)

(73) Assignee: Fusion-IO, Inc., Salt Lake City, UT (US)

( * ) Notice: Subject to any disclaimer, the term of this patent is extended or adjusted under 35 U.S.C. 154(b) by 990 days.

(21) Appl. No.: 12/001,065

(22) Filed: Dec. 6, 2007

(65) Prior Publication Data

US 2008/0313312 A1 Dec. 18, 2008

Related U.S. Application Data

(60) Provisional application No. 60/873,111, filed on Dec. 6, 2006, provisional application No. 60/974,470, filed on Sep. 22, 2007.

(51) Int. Cl.
*G06F 15/16* (2006.01)
(52) U.S. Cl. ........ 709/204; 709/223; 709/224; 709/208; 709/238; 702/118; 702/188; 700/20; 703/27; 703/24; 714/727; 714/10; 714/13; 714/25; 714/E11.154; 710/315; 710/313
(58) Field of Classification Search .......... 709/224, 709/221, 204
See application file for complete search history.

(56) References Cited

U.S. PATENT DOCUMENTS

| | | | |
|---|---|---|---|
| 5,382,950 A * | 1/1995 | Gronemeyer | ................. 710/260 |
| 5,745,671 A | 4/1998 | Hodges | |
| 5,768,152 A * | 6/1998 | Battaline et al. | ............... 702/186 |
| 5,822,759 A | 10/1998 | Treynor | |
| 5,893,138 A | 4/1999 | Judd et al. | |
| 5,969,986 A | 10/1999 | Wong et al. | |
| 6,034,882 A | 3/2000 | Johnson et al. | |
| 6,061,511 A | 5/2000 | Marantz et al. | |
| 6,105,076 A | 8/2000 | Beardsley et al. | |
| 6,321,263 B1 * | 11/2001 | Luzzi et al. | .................... 709/224 |
| 6,418,509 B1 | 7/2002 | Yanai et al. | |
| 6,420,215 B1 | 7/2002 | Knall et al. | |

(Continued)

FOREIGN PATENT DOCUMENTS

EP 1871040 A1 * 12/2007

OTHER PUBLICATIONS

Kennedy, "Exploiting Redundancy to Speedup Reconfiguration of an FPGA", 2003.*

(Continued)

*Primary Examiner* — Ondrej Vostal
(74) *Attorney, Agent, or Firm* — Kunzler Law Group, PC

(57) ABSTRACT

An apparatus, system, and method are disclosed for a baseboard management controller (BMC) which includes an FPGA with a monitor module for monitoring the operations parameters of a host computer device. In addition, the BMC has a host connector that connects the BMC to the system bus of the host computing device, allowing the BMC access to the computing elements on the host. The host connector has reconfigurable pins with connection configuration controlled by the FPGA. In addition, the BMC has a server with a processor and associated non-volatile memory on board. The operating system provides services to the host computing device and its constituent components, as well as allowing advanced networking and interconnectivity with other BMCs in a management network.

23 Claims, 9 Drawing Sheets

U.S. PATENT DOCUMENTS

| | | | |
|---|---|---|---|
| 6,424,872 B1 | 7/2002 | Glanzer et al. | |
| 6,477,617 B1 | 11/2002 | Golding | |
| 6,519,185 B2 | 2/2003 | Harari et al. | |
| 6,525,953 B1 | 2/2003 | Johnson | |
| 6,710,901 B2 | 3/2004 | Pastor | |
| 6,737,675 B2 | 5/2004 | Patel et al. | |
| 6,754,800 B2 | 6/2004 | Wong et al. | |
| 6,779,145 B1* | 8/2004 | Edwards et al. | 714/733 |
| 6,839,819 B2 | 1/2005 | Martin | |
| 6,845,428 B1 | 1/2005 | Kedem | |
| 6,849,905 B2 | 2/2005 | Ilkbahar et al. | |
| 6,881,994 B2 | 4/2005 | Lee et al. | |
| 6,883,068 B2 | 4/2005 | Tsirigotis et al. | |
| 6,928,505 B1 | 8/2005 | Klingman | |
| 6,950,952 B2 | 9/2005 | Felsman | |
| 7,000,063 B2 | 2/2006 | Friedman et al. | |
| 7,005,350 B2 | 2/2006 | Walker et al. | |
| 7,024,695 B1 | 4/2006 | Kumar et al. | |
| 7,069,349 B2 | 6/2006 | Hawkins et al. | |
| 7,069,380 B2 | 6/2006 | Ogawa et al. | |
| 7,081,377 B2 | 7/2006 | Cleeves | |
| 7,162,560 B2 | 1/2007 | Taylor et al. | |
| 7,162,571 B2 | 1/2007 | Kilian et al. | |
| 7,197,657 B1 | 3/2007 | Tobias | |
| 7,200,758 B2 | 4/2007 | Zimmer | |
| 7,215,580 B2 | 5/2007 | Gorobets | |
| 7,219,197 B2 | 5/2007 | Hatakeyama | |
| 7,225,247 B2 | 5/2007 | Kennedy et al. | |
| 7,237,141 B2 | 6/2007 | Fredin | |
| 7,243,203 B2 | 7/2007 | Scheuerlein | |
| 7,248,691 B1 | 7/2007 | Pandit et al. | |
| 7,269,534 B2 | 9/2007 | Mugunda et al. | |
| 7,281,076 B2 | 10/2007 | Yates et al. | |
| 7,293,165 B1 | 11/2007 | Tobias | |
| 7,299,339 B2* | 11/2007 | Ramesh | 712/24 |
| 7,299,354 B2 | 11/2007 | Khanna et al. | |
| 7,305,668 B2 | 12/2007 | Kennedy et al. | |
| 7,318,173 B1 | 1/2008 | Falik et al. | |
| 7,324,614 B2* | 1/2008 | Lee et al. | 375/341 |
| 7,430,465 B2* | 9/2008 | Liebl et al. | 701/35 |
| 7,487,343 B1* | 2/2009 | Insley et al. | 713/1 |
| 7,502,369 B2* | 3/2009 | Teoh | 370/389 |
| 7,505,321 B2 | 3/2009 | Scheuerlein et al. | |
| 7,594,471 B2* | 9/2009 | Koekemoer et al. | 102/301 |
| 7,827,442 B2* | 11/2010 | Sharma et al. | 714/10 |
| 7,873,693 B1* | 1/2011 | Mehrotra et al. | 709/203 |
| 7,885,413 B2* | 2/2011 | Vasic et al. | 380/281 |
| 7,991,940 B2* | 8/2011 | Frydman et al. | 710/315 |
| 8,175,099 B2* | 5/2012 | Hodges et al. | 370/394 |
| 2001/0021924 A1* | 9/2001 | Ohno | 705/37 |
| 2002/0111996 A1* | 8/2002 | Jones et al. | 709/203 |
| 2003/0046380 A1* | 3/2003 | Steger et al. | 709/223 |
| 2003/0101025 A1* | 5/2003 | Shah et al. | 702/188 |
| 2003/0130969 A1 | 7/2003 | Hawkins et al. | |
| 2004/0025064 A1 | 2/2004 | Felsman | |
| 2004/0073806 A1 | 4/2004 | Zimmer | |
| 2004/0078456 A1* | 4/2004 | Kennedy et al. | 709/223 |
| 2004/0098575 A1 | 5/2004 | Datta et al. | |
| 2004/0122559 A1* | 6/2004 | Young et al. | 700/269 |
| 2004/0133771 A1* | 7/2004 | King et al. | 713/100 |
| 2004/0207440 A1* | 10/2004 | Robertson et al. | 327/291 |
| 2004/0228063 A1 | 11/2004 | Hawkins et al. | |
| 2004/0230866 A1* | 11/2004 | Yates et al. | 714/25 |
| 2004/0260947 A1* | 12/2004 | Brady et al. | 713/201 |
| 2004/0267482 A1 | 12/2004 | Robertson et al. | |
| 2004/0267483 A1 | 12/2004 | Percer et al. | |
| 2004/0267486 A1 | 12/2004 | Percer et al. | |
| 2004/0268013 A1 | 12/2004 | Pagan | |
| 2005/0021260 A1 | 1/2005 | Robertson et al. | |
| 2005/0027851 A1* | 2/2005 | McKeown et al. | 709/224 |
| 2005/0071461 A1 | 3/2005 | Mihm et al. | |
| 2005/0071677 A1 | 3/2005 | Khanna et al. | |
| 2005/0076107 A1 | 4/2005 | Goud et al. | |
| 2005/0080887 A1 | 4/2005 | Lee et al. | |
| 2005/0201306 A1* | 9/2005 | Engel | 370/299 |
| 2005/0235088 A1* | 10/2005 | Kang | 710/305 |
| 2005/0271079 A1 | 12/2005 | Teoh | |
| 2005/0276092 A1* | 12/2005 | Hansen et al. | 365/149 |
| 2006/0106514 A1* | 5/2006 | Liebl et al. | 701/35 |
| 2006/0106968 A1* | 5/2006 | Wooi Teoh | 710/316 |
| 2006/0112297 A1 | 5/2006 | Davidson | |
| 2006/0139330 A1* | 6/2006 | Kutch et al. | 345/163 |
| 2006/0143209 A1* | 6/2006 | Zimmer et al. | 707/101 |
| 2006/0149954 A1* | 7/2006 | Hageman et al. | 713/1 |
| 2006/0164111 A1* | 7/2006 | Lopez et al. | 324/760 |
| 2006/0184349 A1* | 8/2006 | Goud et al. | 703/24 |
| 2006/0206286 A1 | 9/2006 | Mugunda et al. | |
| 2007/0016827 A1 | 1/2007 | Lopez, Jr. et al. | |
| 2007/0027948 A1 | 2/2007 | Engebretsen | |
| 2007/0055853 A1 | 3/2007 | Hatasaki et al. | |
| 2007/0088974 A1 | 4/2007 | Chandwani et al. | |
| 2007/0141895 A1* | 6/2007 | Karstens | 439/490 |
| 2007/0143606 A1* | 6/2007 | Bandholz et al. | 713/168 |
| 2007/0169088 A1 | 7/2007 | Lambert et al. | |
| 2007/0169106 A1 | 7/2007 | Douglas et al. | |
| 2007/0174437 A1* | 7/2007 | Kraus | 709/223 |
| 2007/0174686 A1 | 7/2007 | Douglas et al. | |
| 2007/0174705 A1 | 7/2007 | Shih | |
| 2007/0186086 A1 | 8/2007 | Lambert et al. | |
| 2007/0204332 A1 | 8/2007 | Pan | |
| 2007/0206630 A1 | 9/2007 | Bird | |
| 2007/0220369 A1* | 9/2007 | Fayad et al. | 714/48 |
| 2007/0233455 A1* | 10/2007 | Zimmer et al. | 703/27 |
| 2007/0255430 A1* | 11/2007 | Sharma et al. | 700/20 |
| 2008/0005222 A1 | 1/2008 | Lambert et al. | |
| 2008/0005446 A1* | 1/2008 | Frantz et al. | 710/313 |
| 2008/0028058 A1 | 1/2008 | Shaw et al. | |
| 2008/0040522 A1* | 2/2008 | Matthews | 710/107 |
| 2008/0052576 A1* | 2/2008 | Brandyberry et al. | 714/727 |
| 2008/0086580 A1* | 4/2008 | Zhang et al. | 710/107 |
| 2008/0228862 A1* | 9/2008 | Mackey | 709/203 |
| 2008/0229381 A1* | 9/2008 | Sikka et al. | 726/1 |
| 2008/0303692 A1* | 12/2008 | Hirai | 340/825.52 |
| 2009/0013056 A1* | 1/2009 | Weinstock et al. | 709/208 |
| 2009/0100194 A1* | 4/2009 | Bhadri et al. | 709/244 |
| 2010/0180161 A1* | 7/2010 | Kern et al. | 714/47 |

OTHER PUBLICATIONS

Johnson et al., "Single-Event Upset Simulation on an FPGA", 2002.*
Salcic, "PROTOS—A microcontroller/FPGA-based prototyping system for embedded applications", 1997.*
Bhaniramka et al., "OpenGI Multipipe SDK: A Toolkit for Scalable Parallel Rendering", 2005.*
Prado et al., "A Standard Product Approach to Spaceborne Payload Processing", 2001.*
Hauck et al., "Abstract: Runlength Compression Techniques for FPGA Configurations".*
Small et al., "PCI Bus Master in a Quicklogic 8000 Gate FPGA".*
Lattice Semiconductor Corporation, "Parallel Flash Programming and FPGA Configuration", Aug 2007.*
John Ayer et al., "Dynamic Bus Mode Reconfiguration of PCI-X and PCI Designs", Mar. 2007.*
Sunita Jain et al., "Point-to-Point Connectivity Using Integrated Endpoint Block for PCI Express Design", Oct. 4, 2007.*
Staf, "Adaptation of OSEck for an FPGA-Based Soft Processor Platform", Aug. 2007.*
ASPMC_660, Asine Group, http://www.asinegroup.com/products/aspmc660.html, copyright 2002, downloaded on Nov. 18, 2009.
"BiTMICRO Introduces E-Disk PMC Flash Disk Module at Military & Aerospace Electronics East 2004", BiTMICRO, http://www.bitmicro.com/press_news_releases_20040518_prt.php.
NAND Flash 101: An Introduction to NAND Flash and How to Design It in to Your Next Product, Micron, pp. 1-28, Micron Technology Nov. 2006.
Actel Fusion FPGAs Supporting Intelligent Peripheral Management Interface (IPMI) Applications, Actel, www.actel.com, Oct. 2006, 17 pages.
Zircon UL Data Sheet, Remote Management Controller, 2001, Qlogic Corporation.
PCT/US2007/025188, International Search Report and Written Opinion, May 30, 2008.

Guido Braccini, International Preliminary Report on Patentability, PCT/US2007/025188, Feb. 3, 2009.

BiTMICRO Introduces E-Disk PMC Flash Disk Module at Military & Aerospace Electronics East, May 18, 2004, BiTMICRO, http://www.bitmicro.com/press_news_releases_20040518_prt.php.

"Datadirect Storage Systems Selected for NCSA Cluster", High Performance Computing, Aug. 15, 2003, pp. 2, vol. 12, No. 32, http://www.hpcwire.com/hpcwire/hpcwireWWW/03/08/105731.html.

"Introducing Box Hill's Fibre Box", Box Hill Systems Corporation, Jan. 16, 1997, p. 5.

Makulowich, John, "Strategies, Players and Emerging Markets", Washington Technology, Jun. 26, 1997, pp. 6, http://washingtontechnology.com/Articles/1997/06/26/Strategies-Players-and-Emerging-Ma . . . .

"Hynix 48-GB Flash MCP", Slashdot, downloaded Nov. 4, 2010, pp. 17, http://hardware.slashdot.org/article.pl?sid=07/09/06146218&from=rss.

2380.2.13pct, Application No. PCT/US2007/025188, International Preliminary Report on Patentability, Feb. 3, 2009.

* cited by examiner

APPARATUS, SYSTEM, AND METHOD FOR A RECONFIGURABLE BASEBOARD MANAGEMENT CONTROLLER

CROSS-REFERENCES TO RELATED APPLICATIONS

This application is a continuation-in-part of and claims priority to U.S. Provisional Patent Application No. 60/873,111 entitled "Elemental Blade System" and filed on Dec. 6, 2006 for David Flynn, et al. which is incorporated herein by reference

BACKGROUND OF THE INVENTION

1. Field of the Invention

This invention relates to baseboard management controllers (BMC) and more particularly relates to a reconfigurable, networked BMC.

2. Description of the Related Art

In many computing systems, baseboard management controllers (BMCs) are used to provide management functions. The BMC is often the primary part of an intelligent platform management interface (IPMI) architecture and manages the interface between systems management software and platform hardware. BMCs often include sensors to report on operating parameters such as temperature, fan speed, operating system status and the like.

In larger systems, one or more BMCs may communicate with a BMC management utility which allows a user to interface with the BMC and perform limited operations with it. The BMC may also provide error reporting to a user and additional functions such as interrupt handling.

However, the BMCs are typically limited in the functionality that they provide to a user or to the system into which they are incorporated. In addition, the BMCs are often tied down to the hardware that they are designed to manage; as such, problems with the hardware itself may reflect to the BMC as well. This may be especially true if the BMC uses components of the hosting hardware (such as a CPU, or memory) to provide functionality.

SUMMARY OF THE INVENTION

From the foregoing discussion, it should be apparent that a need exists for an apparatus, and system that allows for a reconfigurable BMC. Beneficially, such an apparatus and system would provide a wide range of functionality to both connected host devices and to the system as a whole. In addition, the BMC is ideally easy to reconfigure and fit into a variety of hardware environments.

The present invention has been developed in response to the present state of the art, and in particular, in response to the problems and needs in the art that have not yet been fully solved by currently available BMCs. Accordingly, the present invention has been developed to provide an apparatus, system, and method for a reconfigurable BMC that overcomes many or all of the above-discussed shortcomings in the art.

Disclosed is a baseboard management controller module (BMC) comprising a reconfigurable field programmable gate array (FPGA) with a monitor module monitoring one or more operations parameters of a host computing device. The monitor module is operationally independent of the host computing device.

In one embodiment, a host connector communicatively connects the BMC to a system bus of the host computing device, the system bus providing connectivity between one or more computing elements of the host computing device, the host connector further comprising a plurality of functionally reconfigurable pins, wherein a connection configuration of the functionally reconfigurable pins is established by the FPGA. The BMC also includes a server module comprising a processor, non-volatile memory, and an operating system, the operating system providing the services of one or more modules to the host computing device, the server system is operationally independent of the host computing device.

The BMC may further comprise a network module communicatively connecting the BMC with one or more networks. The management module communicates management transactions over the one or more networks. In addition, the one or more of the networks is a management network exclusively used for management transactions.

The BMC may also receive the power to operate the hardware of the BMC through a network connection to the network module.

The BMC may further comprise a second monitor module, the second monitor module receiving operations parameters from the monitor module and providing a user with a notification in response to receiving one or more operations parameters outside pre-established thresholds.

The BMC may also include one or more emulation modules, each of the one or more emulation modules representing to the computing elements of the host computing device a device directly attached to the host computing device. In addition, the BMC may include one or more boot device emulation modules, each boot device emulation module providing a bit stream to an associated computing element within the host computing device.

The bit stream is one of a plurality of stored bit streams having an associated compatibility profile, each boot device emulation module determining a configuration profile of the host computing device and providing to the associated computing element one bit stream having a compatibility profile consistent with the configuration profile of the host computing device.

The BMC of claim 1, further comprising a security module, the security module executing one or more of validating control messages and management messages sent to the BMC, setting one or more host computing devices in a state compatible with the system security requirements for the one or more computing devices communicating with the host computing device; and validating software and firmware code for the BMC and the one or more host computing devices.

The BMC of claim 1, further comprising an interrupt module configured to generate an interrupt message for transmission to one or more computing devices, and to receive an interrupt message from one or more computing devices, wherein the computing device is one of a local computing device and a remote computing device.

The BMC further comprising a logging module configured to store as data elements in non-volatile memory one or more of the operations parameters of the host computing device, recovery parameters, manufacturing parameters, security events, and environmental events, the logging module further assigning to each data element a storage classification defining permissions and storage characteristics.

The BMC of further comprising an assignment module comprising a subtask module configured to divide a management task into a plurality of subtasks; a delegation module configured to assign an execution order for the subtasks and to assign the subtasks to one or more BMCs communicatively connected to the BMC over the management network; a master module configured to receive response data from the one or more BMCs that received a subtask from the delegation module; and a subtask module configured to receive subtasks from a subtask-initiating BMC on the management network, execute the subtasks, and return response data to the subtask-initiating BMC.

The BMC further comprising an environmental control module configured to control the power settings and the temperature settings of the host computing device, wherein controlling comprises measuring the settings and adjusting settings to put the environment in an environmental profile.

The BMC further comprising a system test module configured to execute one or more systems tests, the systems tests comprising one or more of a power on self test (POST), a diagnostics test, qualification test, and an acceptance test.

The BMC further comprising a scan ring module configured to transfer data between the BMC and one or more devices on the host computing device supporting scan ring access.

The BMC further comprising a code load module configured to request code from one of a local host computing device and an external device and store the code locally on the BMC. The BMC may utilize the code load module to boot itself from one of a local host computing device and an external device.

The BMC further comprises a programmable read only memory (PROM) having one or more boot images for the BMC, including one or more known good boot images, the BMC further comprising a boot module configured to load the known good boot image to the BMC after a failed load of the one or more boot images to the BMC.

The BMC further comprises an update module configured to store a current image in use on the BMC into the non-volatile memory in response to a command to load a new image to the BMC, the update module further configured to restore the current image from the non-volatile memory to the BMC in response to a failure in the new image.

The BMC further comprises a network boot module facilitating the network boot of the host computing system, the network boot module supplying network configuration information to the host computing system.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
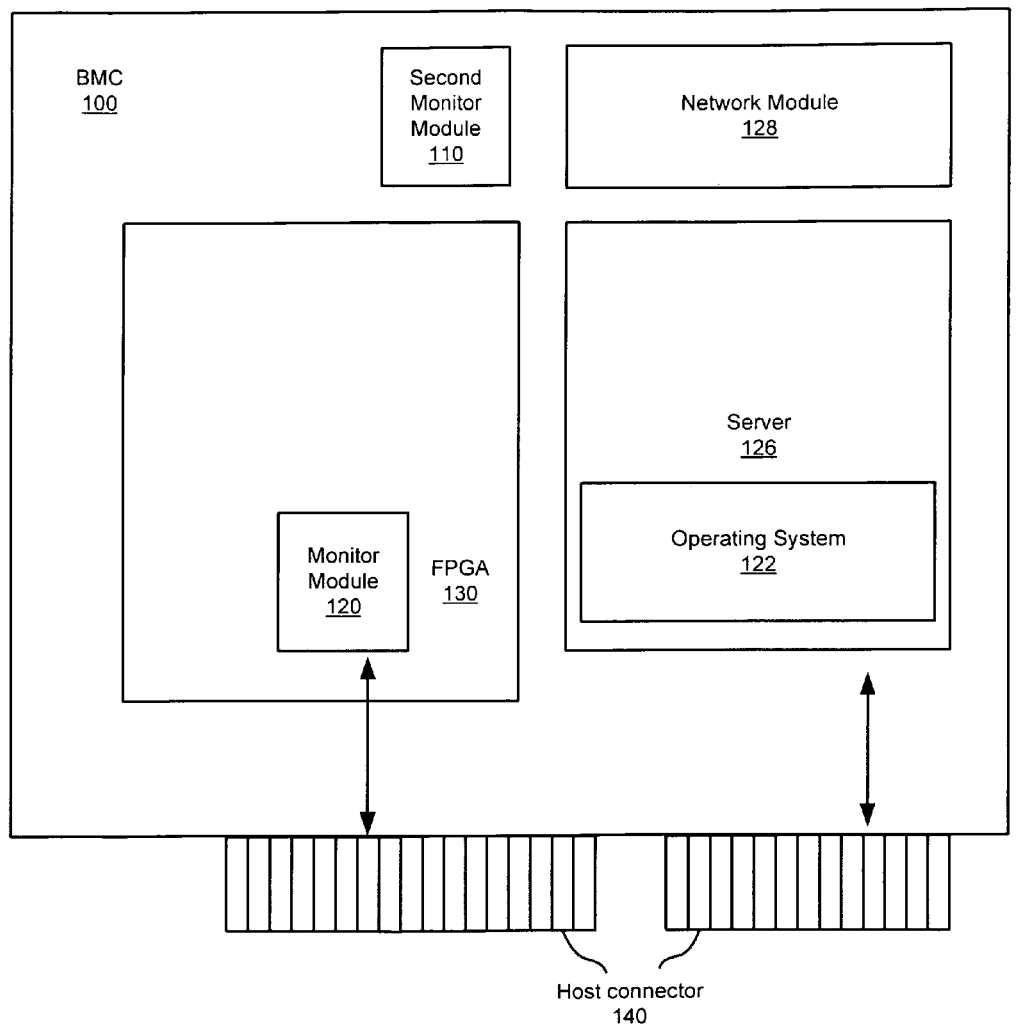
FIG. 1 is a schematic block diagram illustrating one embodiment of a BMC in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a signal bearing medium may take any form capable of generating a signal, causing a signal to be generated, or causing execution of a program of machine-readable instructions on a digital processing apparatus. A signal bearing medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

FIG. 1 is a schematic block diagram of one embodiment of a BMC 100. The BMC 100 includes an FPGA 130 with a monitor module 120, a server 126 with an associated operating system 122, a network module 128, a second monitor module 110 and a host connector 140.

The field programmable gate array (FPGA) 130 is made up of logic cells which may be configured by a user to provide a variety of custom logic functions ranging from very simple operations to more complex combinational functions. The FPGA may have associated with it memory elements ranging from simple flip-flops to blocks of memory such as SRAM. A user may configure the FPGA 130 to provide a wide variety of functions. In the depicted embodiment, the FPGA 130 is configured to perform the functions of a monitor module 120, discussed in greater detail below.

In addition, the FPGA 130 has associated input and output pins allowing it to receive and communicate data from and to a variety of sources. These pins are generally configurable and can be customized according to the needs of the user such that they provide a variety of different connectivity options. A user may, for example, reconfigure the FPGA 130 such that a bit stream previously going to pin A goes instead to pin B. In addition, pins may be reconfigured based on the communications protocol of the device connecting to the pin. For example, a block of pins may be configured to communicate over a PCI express connection but may later be configured to communicate over an Ethernet connection. The various adjustments that have to be made to parameters such as voltage to enable such communications are then handled by the FPGA 130.

The BMC 100 comprises a host connector 140 which communicatively connects the BMC 100 to a system bus of a host computing device. Those of skill in the art will appreciate that the system bus provides connectivity between the different computing elements of the host. As used in the present invention, the term "system bus" is not intended to restrict the connection to any particular location on the host device, such as a northbridge or a southbridge connection. In certain embodiments, the host connector 140 may additionally be split into two or more blocks, as shown in FIG. 1.

The host connector 140 is made up of reconfigurable pins as shown in FIG. 1. The host connector itself may not be the reconfigurable pins of the FPGA 130 itself; for example, in a typical embodiment, the FPGA 130 is placed on a daughter card and connections are established between the pins of the FPGA 130 and the pins of the daughter card. Since the pins of the host connector 140 are tied to the configurable pins of the FPGA 130, the host connector 140 has reconfigurable connections as discussed above. It is further worth noting that the pins are functionally reconfigurable by changing the settings on the FPGA 130.

As a result, the connection configuration of the BMC 100 provided by the host adapter 140 can be reconfigured by the FPGA 130. As a result, the BMC 100 of the present invention can be customized to connect with a wide variety of host computing devices without the need to go through the additional expense of creating additional BMCs for different device types. Instead, the user can simply load appropriate instructions into the FPGA 130 to provide the necessary connectivity for a wide array of possible hosts and applications.

The FPGA 130 of the BMC 100 further comprises a monitor module 120. The monitor module 120 monitors the operations parameters of an attached host computing device. For example, the monitor module 120 may track parameters such as temperature of particular devices provided by one or more thermistors, fan speed, voltages, currents or other operations parameters known to those of skill in the art. This information may be communicated to the monitor module 120 directly or over an IPMI or $I^2C$ interface. The monitor module 120 is preferably operationally independent of the host computing device. As a result, errors or problems in a computing element such as a CPU in the host computing device do not negatively impact the performance of the BMC 100 or bring the BMC 100 offline.

The BMC 100 may also include a second monitor module 110. The second monitor module 110 may provide software support or additional services in relation to the operations parameters provided by the monitor module 120 executed in the firmware of the FPGA 130. In one embodiment, the monitor module 120 may provide operations parameters to the second monitor module 110 which may then provide the data for logging, as described below. The second monitoring module may track trends and determine whether operational parameters are far from baseline historical values. The second monitor module 110 may, based on its evaluation of the data provided to it by the monitor module 120, provide a user with notification of parameters that are outside pre-established thresholds. In addition, the second monitor module 110 may be responsible for directing the BMC 100 to bring a particular computing element of a host computing device, or the host computing device itself, offline.

The second monitor module 110 is depicted as being part of the BMC 100. However, where the BMC 100 has a network connection through either the host computing device or through the network module 128, the second monitor module 110 may in some embodiments be implemented on a remote device.

Operationally independent does not, however, require complete independence from host computing device. For example, the BMC 100 may get power from its connection to the host computing device, and may also depend on the host computing device to provide the necessary infrastructure for cooling, such as a fan. As a result, a failure in a power supply to the host computing device or to a fan may, in fact, bring the BMC 100 offline. Operational independence refers, rather, to the ability to perform requested operational tasks regardless of the status of computing elements connected to the system bus of the host computing device.

The BMC 100 further comprises a server module 126. The server module 126 further includes an associated processor, non-volatile memory, and an operating system 122. In the preferred embodiment, the processor is a general purpose CPU capable of performing a wide range of functions based on a set of instructions. General purpose, in this sense, means that the CPU is suppored by a suite of common software development tools such as compilers, debuggers, etc, and industry standard software modules. This processor is separate from any logic performed by the FPGA 130 itself. In the preferred embodiment, the CPU is a core within the FPGA 130. In a preferred embodiment, both the FPGA 130 and the server 126 have access to the non-volatile memory of the BMC 100. In the preferred embodiment, the BMC 100 contains sufficient non-volatile memory to store one or more operating systems images, test applications, profiles, and server applications within the BMC.

The operating system 122 may be a proprietary system or an open-source system such as a Linux server. The operating system 122 of the server 126 provides the services of one or more management modules to an attached host computing device. As with the monitor module 120, the server 126 is operationally independent of the host computing device.

In one embodiment the BMC 100 also includes a network module 128. The network module 128 may be used to connect the BMC 100 with a network. The BMC 100 may, when attached to the host computing device, have access to a network that is connected to the host computing device itself. However, as discussed above, by providing separate network connectivity through the network module 128 the BMC 100 becomes increasingly operations independent of the host computing device.

The network module 128 may further the operations independence of the BMC 100 if the network connection is a powered network connection such as powered Ethernet. In one embodiment, the network module 128 is capable of providing power to the BMC 100 from an attached network. Thus, in case of a power failure on the host computing device, the BMC 100 remains operational. In this embodiment, the BMC is able to control power to the host device without a separate, standby power distribution. The BMC 100 may additionally be configured to receive power from either or the host or the network, providing the BMC 100 with redundant power systems.

Figure 2:
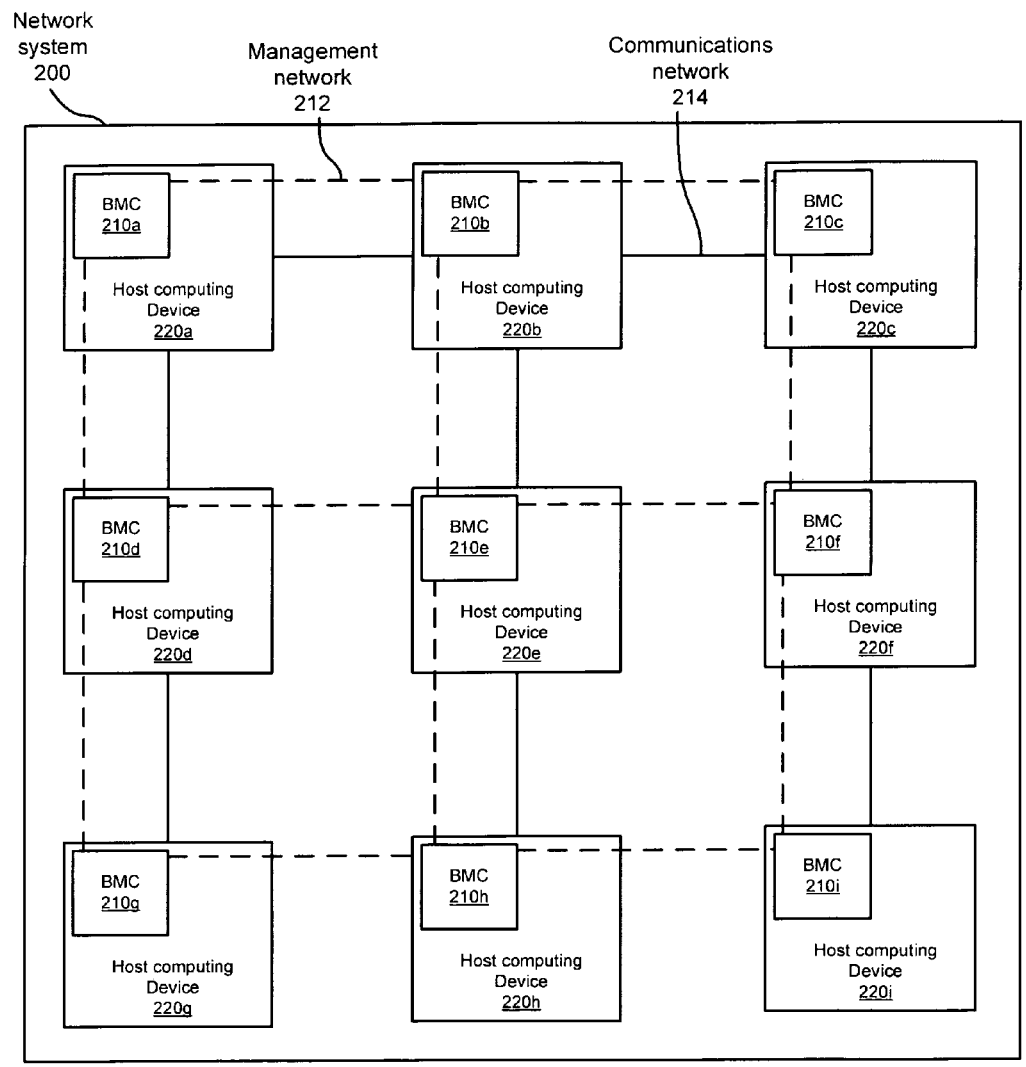
FIG. 2 is a schematic block diagram illustrating one embodiment of a network of BMCs in accordance with the present invention.

FIG. 2 illustrates one embodiment of a network system 200 of networked host computing devices 220a-i with associated BMCs 210a-i. In one embodiment, the BMCs 210a-i communicate and share information and tasks with one another, as described in greater detail below. Also shown in FIG. 2 are two networks: a communications network 214 which connects the host computing devices 220a-i, and a management network 212 connecting BMCs 210a-i. There may be additional networks, including redundant management networks 212 and redundant communications networks 214. In a preferred embodiment, the BMCs 210a-i are the only devices which have access to, and communicate over, the management network 212. As a result, the one or more management networks 212 are exclusively used for management transactions for the network system such as interrupts. The management networks 212 may be connected to the BMCs 210a-i through their respective network modules.

The BMCs 210a-i may additionally communicate over the one or more communications network 214 through the connected host computing devices 220a-i. As a result, the BMCs 210a-i may have multiple redundant network connections which provide additional bandwidth as well as insurance against the risk of failure in any particular link or network.

While the depicted network system 200 shows a management network 212 as a mesh, and similarly shows the communications network 214 as a mesh, those of skill in the art will appreciate that a wide variety of network configurations are possible without departing from the essential characteristics of the present invention. Typically the networks are switched networks (not shown). In one embodiment, the switched networks are Ethernet networks.

Figure 3:
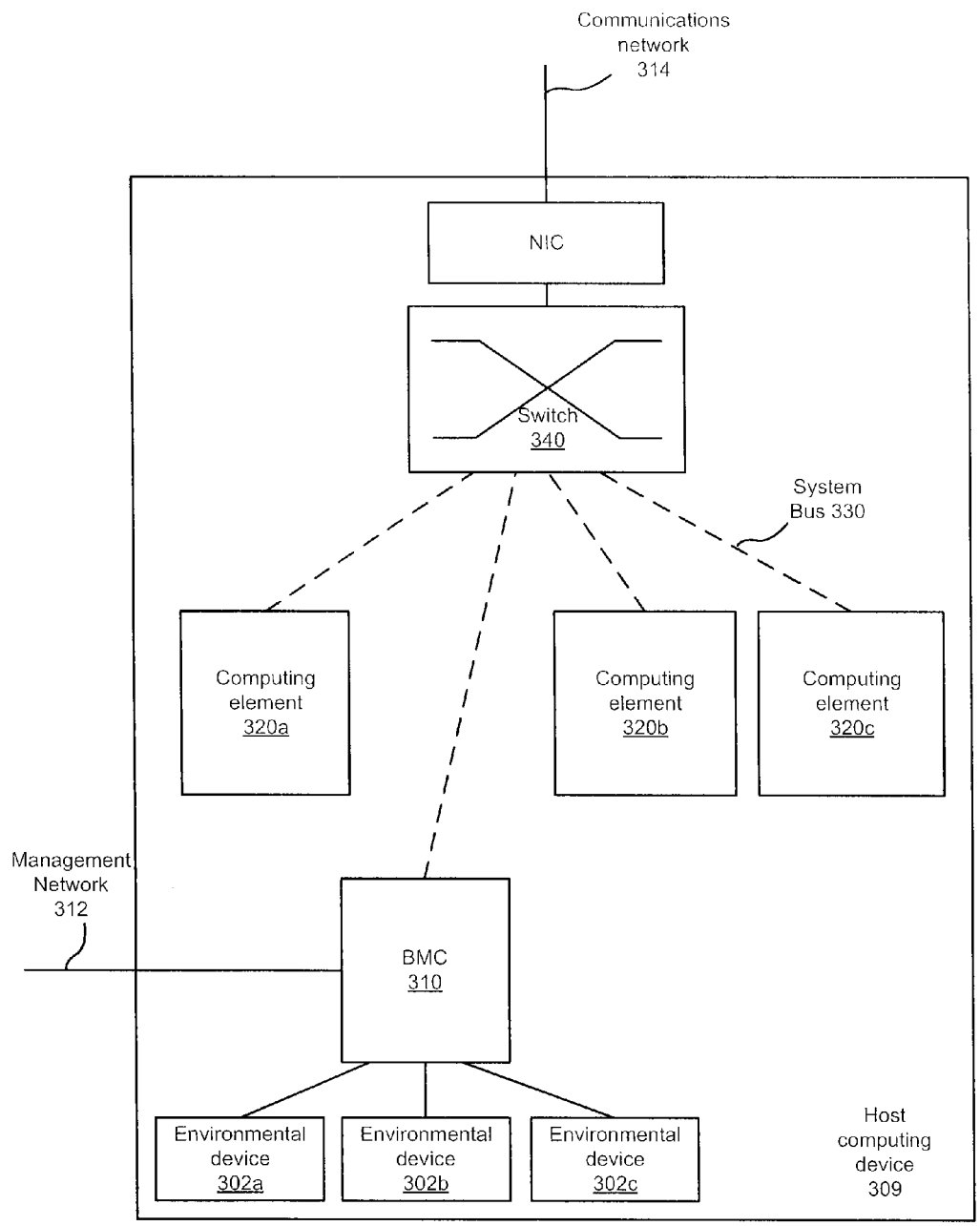
FIG. 3 is a schematic block diagram illustrating one embodiment of a host computing device in accordance with the present invention.

FIG. 3 is a schematic block diagram of a host computing device 309 with a network connection over the communications network 314. The host computing device 309 includes computing elements 320a-c which connect to the host computing device 309 on the system bus 330. The computing elements 320a-c may be a variety of different types of devices, such as CPUs, microcontrollers, peripheral devices, and others known to those of skill in the art. The various computing elements 320a-c interact and communicate through the system bus 330. Those of skill in the art will also appreciate that the number of type of computing elements 320a-c may vary greatly based on the purpose and design of the host computing device 309.

The host computing device 309 also includes a switch 340 which provides connectivity between the computing elements 320a-c of the host computing device 309 and other host computing devices connected over the communications network 314. In addition, the BMC 310 is connected to the switch 340 and the management network 312. As explained above, the BMC 310 may thus use both the communications network 314 and the communications network 314 to communicate management data such as interrupts.

The BMC 310 also connects to one or more environmental devices 302a-c in the host computing device 309. Environmental devices 302a-c include devices designed to influence the environment of the host computing device 309. For example, the BMC 310 may connect to an environmental device 302b that is a fan controller. The BMC 310 may also control the fan directly. The BMC 310 can adjust the fan speed in response to increases in temperature in addition to monitoring the fan speed and the temperature in the host computing device 309 through the monitor module 110 described above.

As mentioned above, these devices may be connected through a variety of interfaces, and may be bussed, daisy-chained, networked, and connected directly. The BMC 310 may connect to the environmental device 302a-c through the system bus, or may also connect to them on a number of different buses such as an IPMI bus, I2C bus, or other known to those of skill in the art.

In one embodiment, the BMC 310 is attached to a root port and discovers devices attached to the system bus. Through this process, the root discovers the other computing elements 320a-c and the BMC 310. The root may, in response to discovering a certain type of device, request associated information or data from one or more of the computing elements 320a-c. For example, the host computing device 309 may discover a network device and request that a file server attached to the network device provide it with information such as operating system files. In another embodiment, the BMC 310 is simply another resource which is discovered.

Figure 4:
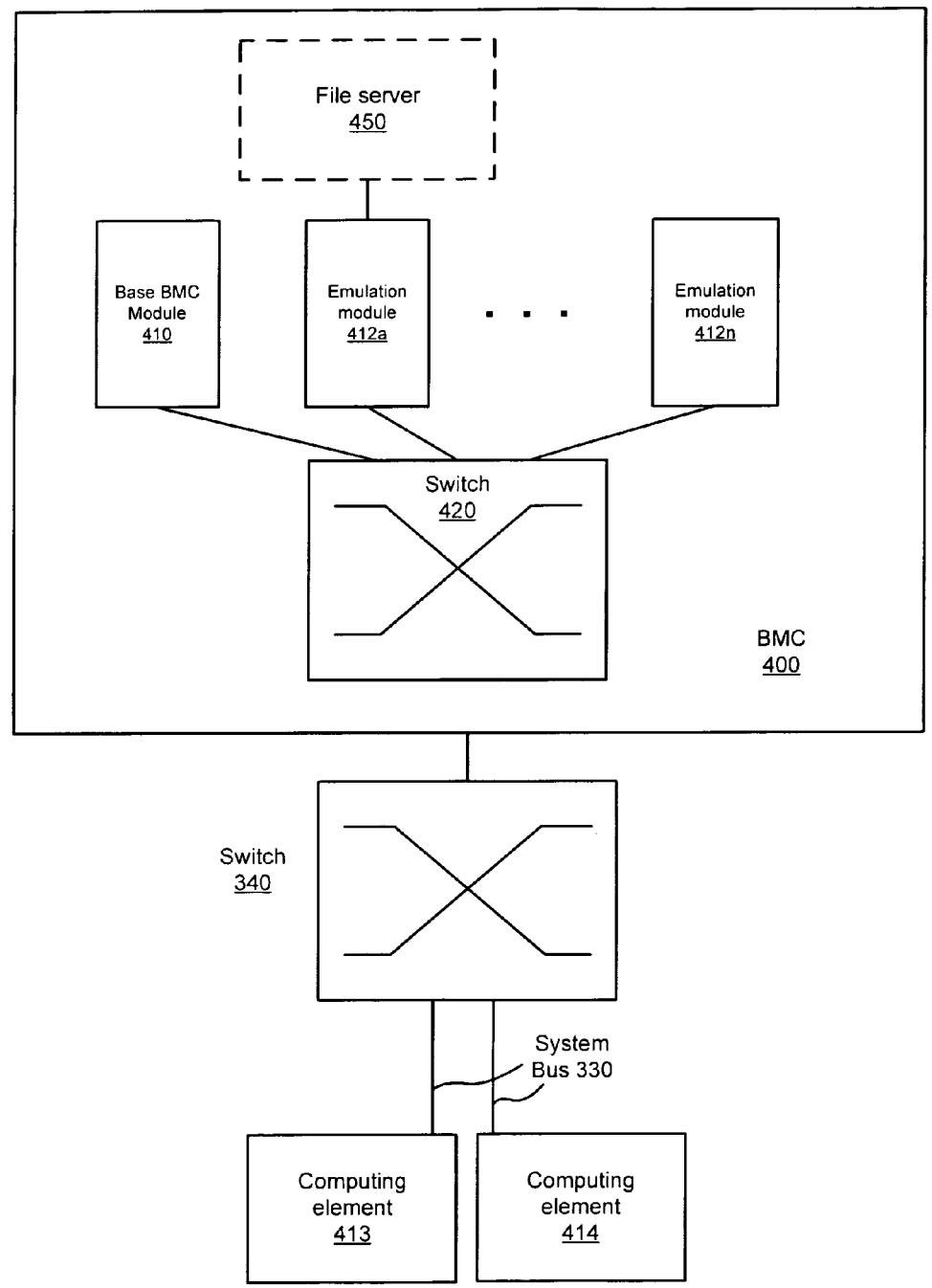
FIG. 4 is a schematic block diagram illustrating one embodiment of a BMC with emulation modules in accordance with the present invention.

FIG. 4 illustrates a BMC 400 comprising a switch 420, a base BMC module 410, and emulation modules 412*a-n*. FIG. 4 further illustrates a computing element 414 communicating with the BMC 400 through a switch 340 attached to the system bus 330, comparable to that shown in FIG. 3. In the preferred embodiment, the switch 420 is integrated within the BMC. Those of skill in the art will appreciate that, while only a single computing element 414 is shown in isolation, the computing element 414 many bus attached devices.

In the context of the discussion preceding FIG. 4, the computing element 414 may be a root computing element 414 discovering attached devices. As part of the discovery process, the computing element 414 finds the BMC 400 as part of the host computing device. However, the BMC 400 comprises one or more emulation modules 412*a-n* connected to various ports of the switch 420. The emulation modules 412*a-n* represent to the computing element 414 of the host computing device a device directly attached to the host computing device.

For example, the computing element 414, as part of the discovery process, may find a computing element 413 physically attached to the system bus 330 and part of the host computing device. The computing element 413 may be a peripheral such as a graphics card. In discovering the BMC 400, however, rather than simply discovering the BMC 400 as a single computing element such as the computing element 413, the BMC 400 represents to the computing element 414 that it is in fact n number of computing devices physically connected to the system bus 330 via the switch 420. In one embodiment, the BMC 400 associates each emulation module 412*a-n* with a particular port on the switch 420.

The BMC 400 may represent to the computing element that one of the attached devices is a base BMC module 410. The base BMC module 410 may simply represent a set of core functionality and operations that a computing element 413 would expect of a BMC 400. In addition, the BMC 400 may include an emulation module 412*a* which it represents to the computing element 414 as a network connection. As part of the discovery process, the "discovered" network connection (in reality, emulation module 412*a*), provides information to the computing element 414 about the network connection.

The computing element 414 may be configured such that, in response to discovering a network connection or port with the characteristics reported by the emulation module 412*a*, the computing element requests information from a file server 450 which it expects to be attached. The computing element 414 makes the request from the emulation module 412*a*. While the emulation module 450 does not have a file server 450 attached, it may utilize the server 126 of the BMC 400 to provide the necessary files or service requested. The result is that the BMC 400 serves the files to the computing element 414.

Thus, while the file server 450 is not physically attached to the host computing device, it is logically attached to the host computing device such that the computing element 414 accesses it and uses it as if it were physically part of the relevant system.

Thus, based on the configuration of the BMC 400 implemented by the user, the BMC 400 can represent a wide range of devices which the computing elements 413 and 414 of a host computing device believe to be physically attached.

Figure 5:
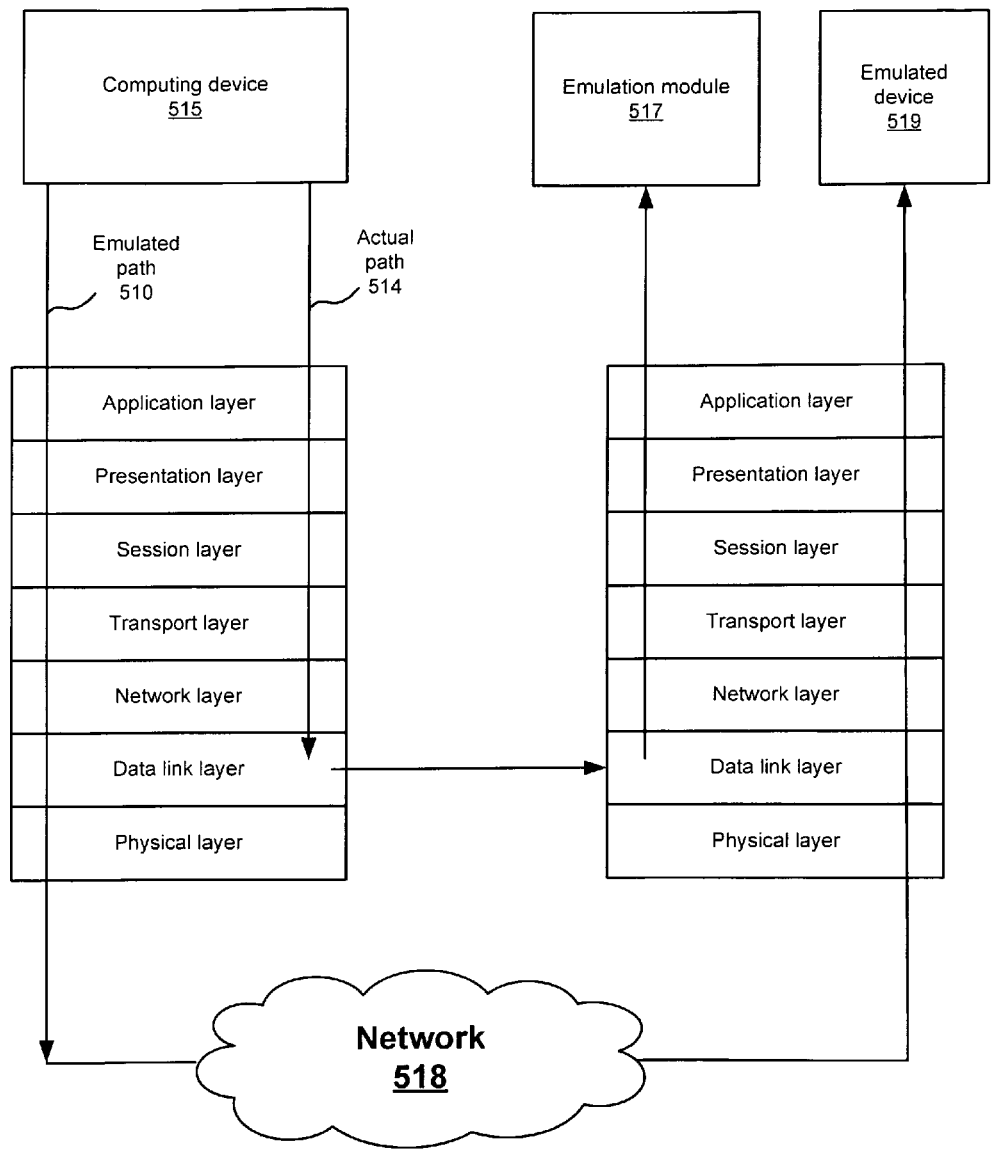
FIG. 5 is a schematic block diagram illustrating one embodiment of a BMC emulation behavior in accordance with the present invention.

FIG. 5 is an illustrative example of the operations of the BMC 400 with one or more emulation modules in reference to the Open Systems Interconnection Basic Reference Model (OSI) layers. The computing device, 515, in requesting data or service from an emulated device 519 (such as a file server) cannot tell the difference between the actual path 514 and the emulated path 510. The emulated path 510 is that the request moves through each of the OSI layers, through a network 518, and back up through the OSI layers to the emulated device 519. The return path to the computing device 515 from the emulated device 519 would be similar.

In contrast, the actual path 514 taken is that the request is "jumpered" before it actually reaches the network 518. In one embodiment, this jumpering occurs in the data link layer. However, dependent on the hardware and the nature of the devices involved, the precise location of the jumpering may vary. The jumpered request moves back through the OSI stack to the emulation module 517, which similarly returns it to the computing device 515. Of note is the fact that, to the computing device 515, the emulated path 510 and the actual path 514 are indistinguishable; that is, the computing device 515 acts as if it is in fact communicating with a particular device and not an emulation of the device.

Figure 6:
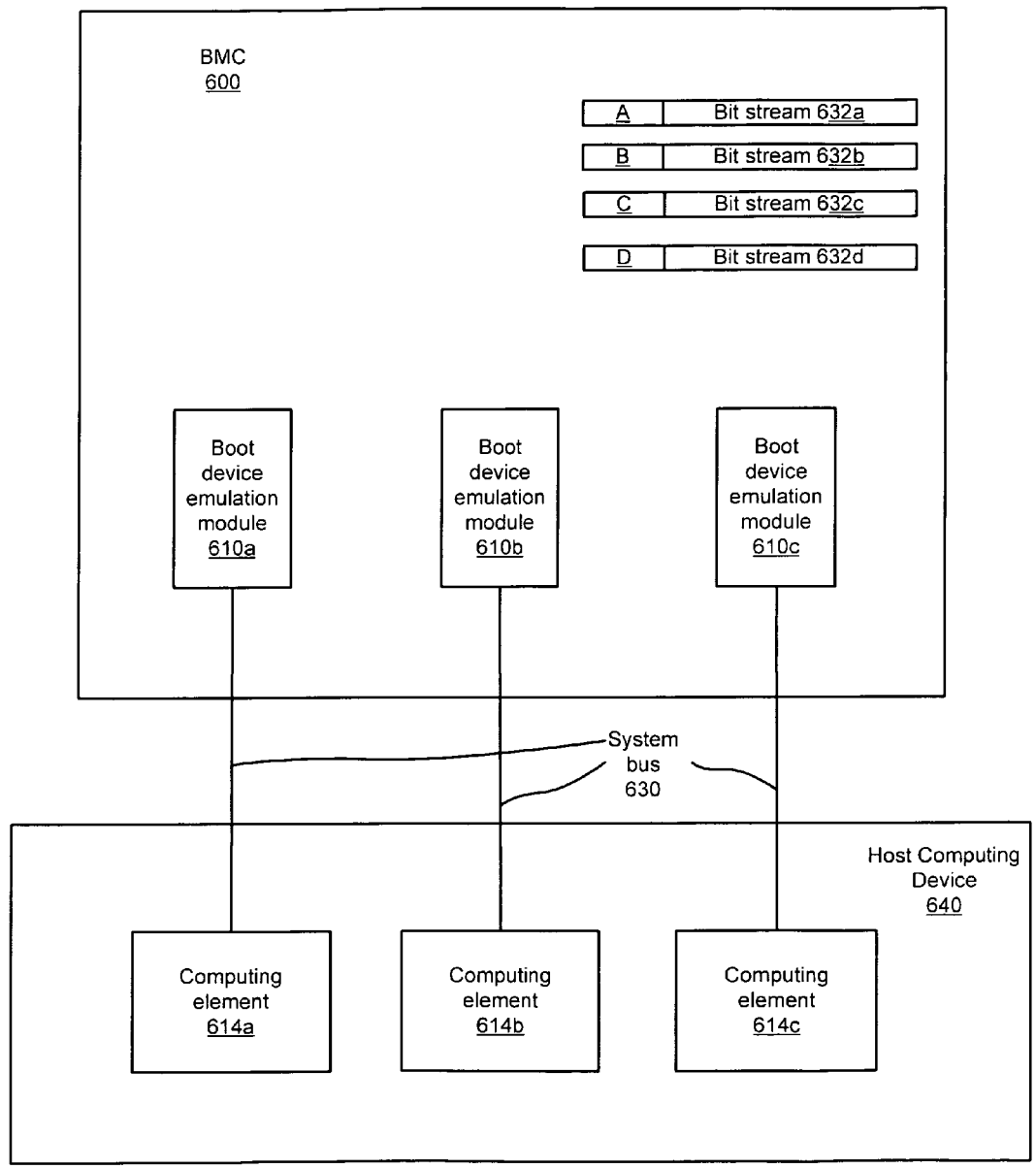
FIG. 6 is a schematic block diagram illustrating one embodiment of a BMC with boot device emulation in accordance with the present invention.

FIG. 6 illustrates one embodiment of a BMC 600 including boot device emulation modules 610*a-c* and bit streams 632*a-d*. Those of skill in the art will recognize that a computing element 614*a-c* of a host computing device 640 often incorporates a memory device, such as a PROM, EEPROM, or other such device known to those in the art to serve as a boot PROM or a boot device. In one embodiment of the present invention, the BMC 600 includes one or more boot device emulation modules 610*a-c* which take the place of the physical boot devices connected to the computing elements 614*a-c*.

Comparable to the previous emulation module discussed above, the boot device emulation module 610*a-c* represents itself as the boot device for the associated computing element 614*a-c*. As discussed above, the BMC 600 connects to the host computing device 640 along its system bus 630, allowing the BMC 600 to provide a connection between a boot device emulation module 610*a-c* and the associated computing element 614*a-c*.

Each boot device emulation module 610*a-c* provides to its computing element 614*a-c* a bit stream 632*a-d*. The BMC 600 may have a plurality of bit streams 632*a-d* stored in non-volatile memory, or may otherwise have access to bit streams 632*a-d* over a network connection. The boot device emulation modules 610*a-c* selects from among the bit streams 632*a-d* a bit stream to provide for the boot operation of the associated computing element 614*a-c*.

In one embodiment, each host computing device 640 may have a configuration profile associated with it. As known to those of skill in the art, each computing element 614*a-c* must be operating in a manner which is compatible with the operations of the other computing elements 614*a-c* in the host computing device. As such, each bit stream 632*a-d* has a compatibility profile A-D associated with the particular bit stream. Each boot device emulation module 610*a-c* determines the configuration profile of the host computing device and provides to the associated computing element 614*a-c* a bit stream 632*a-d* having a compatibility profile A-D consistent with the configuration profile of the host computing device 640.

Figure 7:
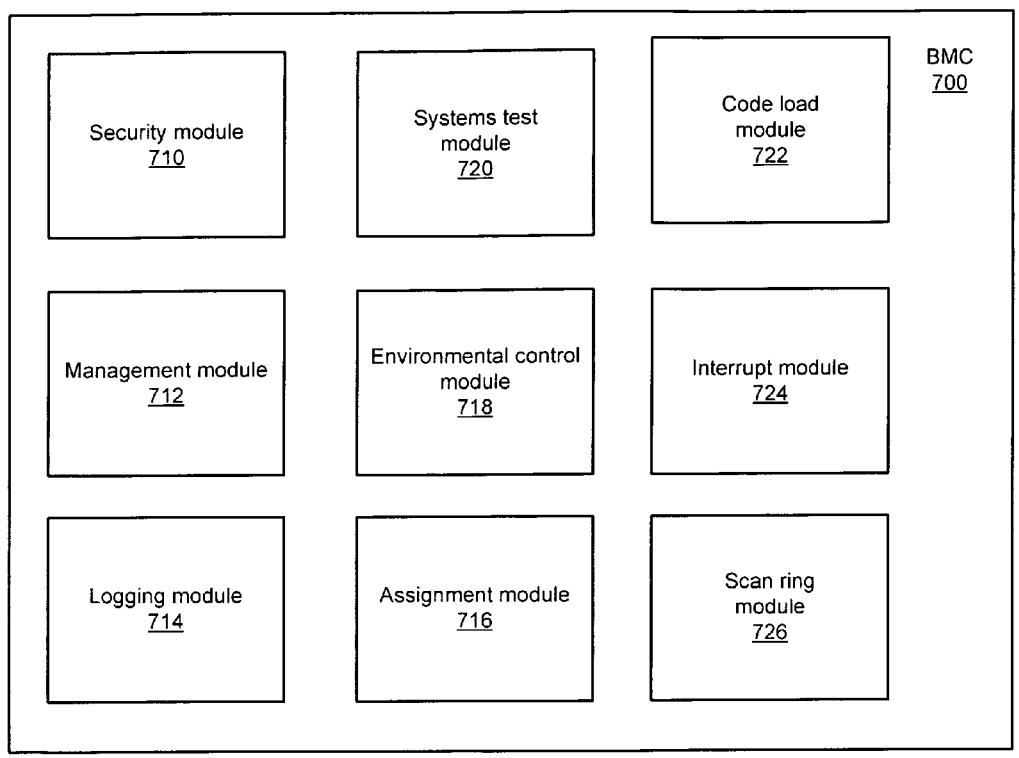
FIG. 7 is a schematic block diagram illustrating one embodiment of a BMC in accordance with the present invention.

FIG. 7 is a schematic block diagram illustrating one embodiment of a BMC 700 with a security module 710 that provides secure communication to the one or more networks by validating management requests sent to the BMC 700 for execution. In one embodiment, the security module 710 parses incoming requests to ensure that these meet the requirements of a specific management protocol. In another embodiment, the security module 710, checks incoming requests for consistency with established rules and security profiles for the system. An one example, the BMC ensures that rules for powering up the system in the face of known fault scenarios are followed. In another example, while operating within a specific security profile, all access to scanned data might be blocked. In another embodiment, the security module 710 ensures that messages are received by a trusted source. In one embodiment, the security module 710 may utilize a trusted authentication agent in conjunction with standard industry key exchange procedures to validate messages. In another embodiment, the security module 710 uses secure sockets, VPNs, and other industry standard means to ensure the source of the message. In another embodiment, the security module 710 uses one or more factor authentication to ensure the sender of the messages is authorized. One skilled in the art will recognize a variety of standard practices that may be used to ensure that messages received by the BMC are authorized for execution.

Security module 710 may also be used to configure devices within the managed system in order to meet the requirements of a specific security profile. In one embodiment, the security module 710 configures network devices by establishing routing tables, providing keys, establishing VLANs, and setting control registers. In another embodiment, the security module 710 provides media keys to local or remote storage devices. In another embodiment, the security module 710 provides keys for storage objects. In another embodiment, a BMC provides acts as a key exchange server for other BMCs operating as distributed management controllers. Security module 710 may also be used to confirm that management software, including one or more of boot-PROM, test code, operating system code, device drivers, initialization code, firmware, BMC application software, etc are one or more of appropriately registered, verified, correctly stored, and correctly loaded. One skilled in the art will recognize a variety of operations that can be performed by a BMC to ensure that the managed system is configured for safe, secure operation.

System test module 720 loads and operates a variety of test programs to validate the BMC itself, and devices and systems under management by the BMC. These tests include one or more of power-on self tests (POST), diagnostics tests, qualification tests, and acceptance tests. These tests may be initiated by local or remote management requests, as a consequence of detected faults, and in conjunction with standard system operating procedures. For example, memory tests may be automatically initiated when error rates with attached DRAM exceed a set limit. In a typical application, a subset of tests will be run during every power on cycle. In one embodiment, the selection of power-on tests may be determined through rules based on state information. For example, a system that has been reset in order to boot a new image of an operating system may choose to bypass the majority of the POST test suite. In another embodiment, qualification tests may be coordinated with system environmental margin changes as part of an automated qualification test suite. In another embodiment, a BMC 700 may coordinate testing by a group of BMCs 700 participating in a system-wide test. One skilled in the art will recognize other advantages of having a BMC 700, or a cluster of BMCs 700 manage the testing of individual devices, combinations of devices, subsystems, or the entire system.

The BMC 700 further includes a management module 712 that communicates management transactions over one or more networks, such as the communications network or the management network as discussed above. The management module 712 may, for example, communicate interrupts over the one or more networks. The management module 712 may additionally support XML, SOAP, and other similar standards known to those of skill in the art.

The BMC 700 further comprises an environmental control module 718 configured to control the power settings and the temperature settings of the host computing device and its constituent computing components. The environmental control module 718 may, for example, adjust voltages and temperature up and down to facilitate stress testing the host computing device.

Thus, the environmental control module 718 can margin the power by adjusting voltages up and down on various supplies to the computing elements while they are running. In one embodiment, the environmental control module 718 may be loaded with a number of environmental profiles. These profiles may be for use in testing the host computing device. The environmental control module 718 loads a profile and adjusts the environment of the host computing device accordingly.

The environmental control module 718 can be used for a variety of purposes. It may be used to perform corner testing of the host computing device by putting the power and temperature conditions at the four corners of the performance parameters (high temperature, low power; low temperature, high power, etc.). The environmental control module 718 may also be used to drop power to components such that they show their propensity for failure. The environmental control module 718 may raise the power to facilitate over-clocking. Other advantages to the environmental control module 718 will be appreciated by those of skill in the art.

The BMC 700 further comprises a code load module 722 which can request code from a local computing device, such as a computing element on the host computing device, or may also request code from a remote computing device connected to the BMC 700 over a network such as the communications network or the management network. The code load module 722 then stores the code locally on the BMC 700. In one embodiment, the code load module 700 stores the code on solid state storage.

The BMC 700 may then boot itself from a local host computing device or an external device. While in a traditional system code is usually pushed to devices such as the BMC 700, the present invention allows the BMC 700 to pull code. As a result, the BMC 700 can boot other profiles, security configurations, or otherwise make modifications. The BMC 700 may, for example, get a task message to reboot according to a particular profile. The BMC 700 can open the profile, find the necessary code either locally or on the network using the code load module 722, store them on its own PROM, and initiate the reboot. As a result, the BMC 700, in the event of a failure, can feasibly retrieve diagnostic code and load it.

The BMC 700 may utilize the assignment module 716 to leverage the power of the networked BMC 700 system. The BMC 700 in the course of operation may receive or initiate management tasks. For example, the BMC 700 may receive an interrupt message requiring a particular action. Or, the BMC 700 may initiate an operation such as powering on a blade server system. The assignment module 716 includes a subtask module which divides the particular management task into one or more subtasks that can be processed independently.

A delegation module then takes the subtasks and assigns an execution order to each of the tasks. In certain embodiments, the assignment of an execution order may result in a determination that all subtasks can be executed in parallel. In other instances, such as power sequencing, the tasks should be performed in a particular order. The delegation module further assigns the subtasks to one or more of the BMCs which are connected to the BMC 700 over one or more networks.

The assignment module 716 further includes a master module which receives response data from the BMCs that received a subtask. The master module may simply receive confirmation of successful operations. For example, a BMC may simply report that it successfully powered on a particular host computing device. The master module may also receive data and compile the data received from the participating BMCs into a unit.

The assignment module 716 also includes a subtask module which receives subtasks from other subtask-initiating BMCs on the network. The subtask module then executes the particulars of the subtask and returns a response to the initiating BMC.

Thus, the BMC 700 can take advantage of the massive parallelism available to it as part of the network of BMCs. In addition, the BMC can distribute and balance work load across available devices participating in the management of the system.

In one embodiment, the BMC 700 uses the assignment module 716 to translate interrupt requests received over a bus such as the I$^2$C bus. The BMC 700 passes the interrupt task to the assignment module 716 which can translate a simple message ("power on") into a more complex interpretation ("power on BMCs x, y, and z, in the following order") more suitable to the particular network of devices.

The scan ring module 726 provides connectivity and control of scan rings supported by a variety of devices managed by the BMC 700. Scan rings provide the ability to access registers within these devices. An example of a scan ring is JTAG. In one embodiment, the BMC 700 utilizes the scan ring to load configuration vectors into an attached device. In another embodiment, the BMC 700 utilizes the scan ring to load test vectors into the attached devices. This may be done as part of one or more test processes as described above. The scan ring can also be used to read data located within the attached device. In one embodiment, the BMC 700 scans a device in response to an error or failure to acquire data otherwise unavailable. In another embodiment the BMC 700 scans a device to diagnose a fault and isolate the fault to a field serviceable unit. One skilled in the art will recognize the benefit of the BMC accessing attached devices through scan rings.

The BMC 700 may further comprise an interrupt module 724. The interrupt module 724 generates interrupt messages for the BMC 700 and transmits the interrupt messages to other computing devices. The computing device may be a local computing device, or it may be a remote computing device connected through a network connection. The computing device may be another BMC in the system. The interrupt module 724 also receives interrupt messages from other computing devices, both local and remote.

The logging module 714 stores data for later access, and analysis. Data collected by the environmental control module 718, the security module 710, the system test module 720, and other modules may be temporarily or permanently stored in the solid-state storage. In one embodiment, manufacturing data including date of manufacture, lot codes, serial numbers, are permanently stored in the BMC. This data may include information for the BMC and for the managed devices. In one embodiment the manufacturing data is used to control software and firmware revision updates. In another embodiment, the manufacturing data is used identify likely failure mechanisms. Those skilled in the art will recognize other data that may be stored for use in testing, diagnosing, and servicing a BMC or managed system.

The logging module 714 may access system data distributed among a set of BMCs through one or more network connections as described above. The logging module 714 may access a database server to manage data stored locally in the solid-state storage BBB, or stored throughout the distributed BMC devices.

The logging module 614 may access system data distributed among a set of BMCs through one or more network connections as described above. The logging module 614 may access a database server to manage data stored locally in the solid-state storage BBB, or stored throughout the distributed BMC devices.

Whereas the logging data may be permanently stored, this data may follow the managed device if it is moved, refurbished, upgraded, or otherwise repurposed.

Environmental data collected by one or more modules 718 may be stored by logging module 714 to track temperatures, performance, boot cycles, OS, device driver, and software upgrades, power-on hours, login data, etc. that may be used to optimize system performance, track bugs, audit security access and a wide variety of other applications and purposes. These applications may run on servers running with the one or more BMCs 700, or operate independently by remotely accessing the data through the logging module or offloading the data from the logging module. One skilled in the art will recognize the benefits of having log data locally stored on the BMC.

Figure 8:
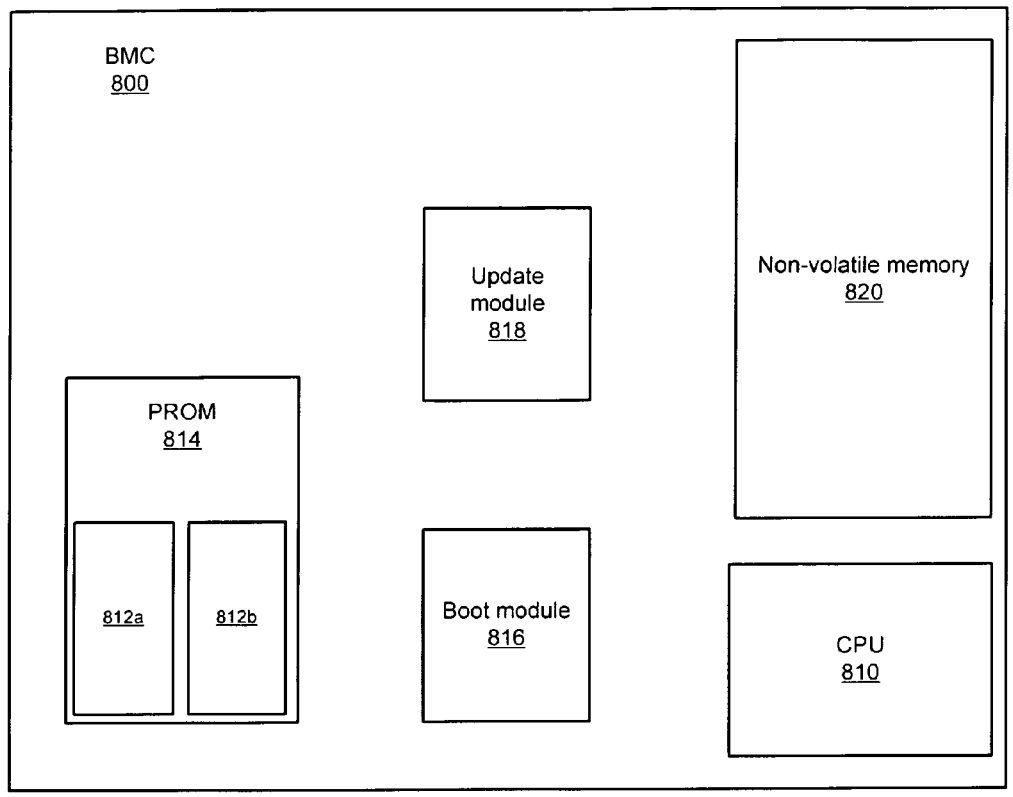
FIG. 8 is a schematic block diagram illustrating one embodiment of a BMC with update and boot module functionality in accordance with the present invention.

FIG. 8 illustrates a BMC 800 comprising a PROM 814, an update module 818, a boot module 816, non-volatile memory 820, and a CPU 810. The PROM 814 includes one or more boot images 812*a-b* for the BMC 800. At least one of these boot images 812*a-b* is a known good image. When the BMC 800 loads a new boot image 812*a-b* into the CPU 810 the load may fail. For example, power may have been cut off during a burn of the boot image 812*b* into the PROM 814. In the event of a failure, the boot module 816 loads the known good boot image 812*a*.

The update module 818 stores a current boot image of the BMC 800 into the non-volatile memory 820 when a command is given to load a new boot image to the BMC. The update module 818 can then restore the current image in the event of a failure in the boot operation.

Figure 9:
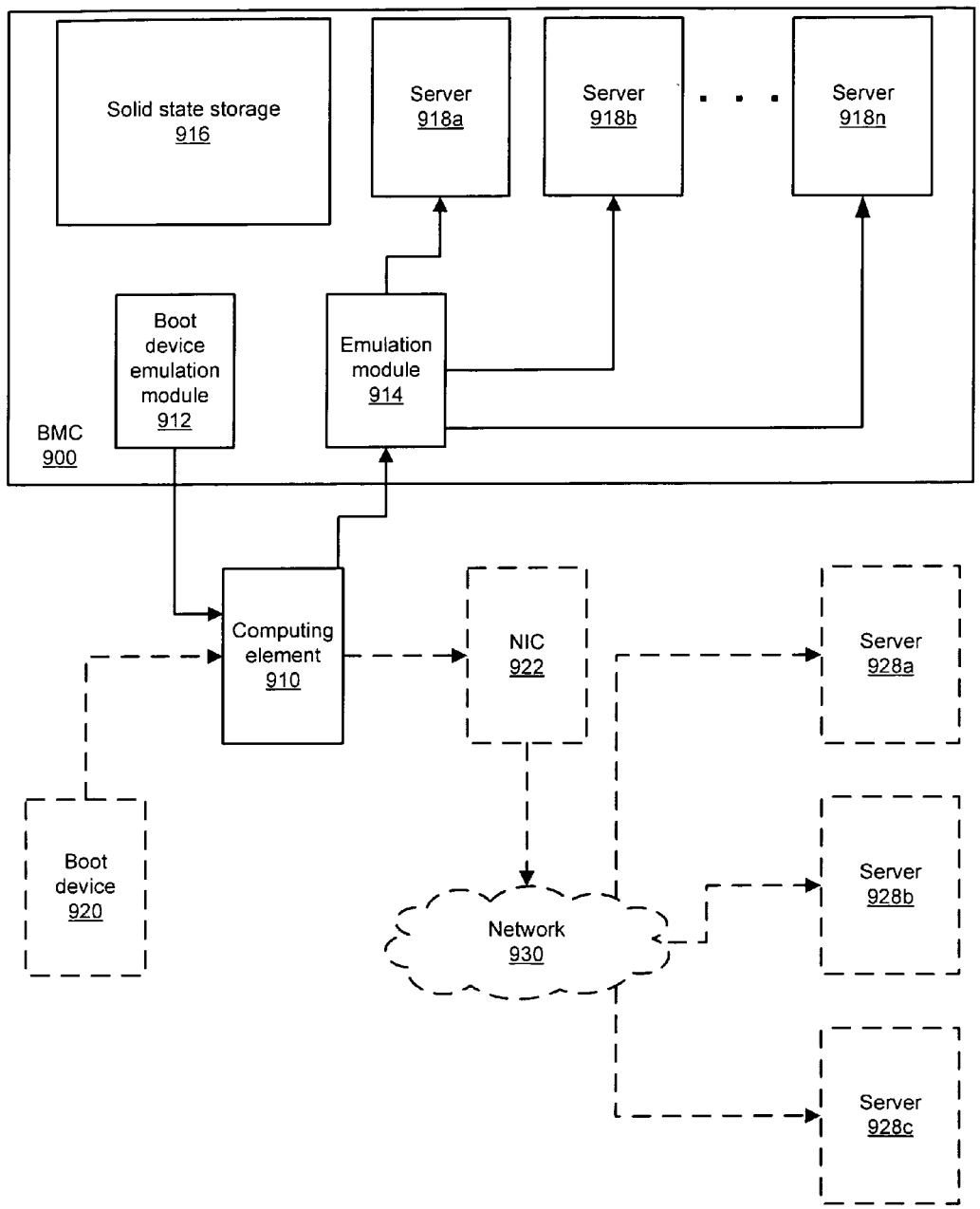
FIG. 9 is a schematic block diagram illustrating one embodiment of a BMC performing a network boot in accordance with the present invention.

The BMC 900 of FIG. 9 has the ability of combining the functions of the emulation module 914, and one or more servers 918 to provide advanced boot features beyond the boot from PROM emulation described above. Once a standard BIOS has been loaded on computing element 910, computing element has the ability to go out to a network to obtain a network boot. This process is common in diskless servers. Typically the NIC 922 would provide access through the network 930 to a variety of servers 928. Server 928*a* might provide basic network services such as DHCP or PIXI, thereby allowing computing element 910 to configure base network access. Server 928. The computing element 910 may then access server 928 providing distributed network support through a service such as TFTP. Subsequently, computing element 910 might access file server 928*c* to obtain drivers, profiles, and other configuration data to complete the boot and initialization process.

The BMC 900 has the ability to provide all of these services through a network emulation module 914 and servers 918*a*, 918*b*, and 918*c* operating within the BMC or as a distributed set of BMCs communicating over the one or more networks to provide the same services provided by servers 928*a*, 928*b*, and 928*c* respectively. This allows the computing element 910 to be reset, booted, and fully initialized independent of all other system elements. The BMC, as described above, has the ability to provide management, selection, and control to load a variety of system images for a variety of purposes. By offloading these processes to the one or more BMCs, entire systems of computing elements 910 can be simultaneously, and dynamically provisioned and managed reducing down time, improving system virtualization, and reducing operational overhead and costs.

Whereas the BMC is attached directly to the system bus, it enables computing element 910 to load or reload system images much faster than is possible with standard storage devices. This allows the managed system to be tested, and diagnosed simply and easily without affecting other system resources, or without the availability of those system resources. One skilled in the art will appreciate the wide variety of capabilities represented by having a BMC that is able to emulate a variety of devices and supply services through those emulated devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A baseboard management controller module (BMC) comprising:
    a reconfigurable field programmable gate array (FPGA) comprising a monitor module configured to monitor one or more operations parameters of a host computing device, the monitor module configured to be operationally independent of the host computing device;
    a host connector configured to communicatively connect the BMC to a system bus of the host computing device, the system bus configured to provide connectivity between one or more computing elements of the host computing device, the host connector further comprising a plurality of functionally reconfigurable pins, wherein a connection configuration of the functionally reconfigurable pins is established by the FPGA;
    a server module comprising a processor, non-volatile memory, and an operating system, the operating system configured to provide services of one or more modules to the host computing device, the server module configured to be operationally independent of the host computing device;
    wherein the host connector is configured to implement a plurality of different connection configurations based on logic programming of the FPGA, a particular connection configuration of the plurality corresponding to a communication protocol used by the system bus of the host computing device;
    wherein the reconfigurable FPGA is configured to establish a first connection configuration of the plurality of different connection configurations and is configured to establish a second connection configuration of the plurality of connection configurations subsequent to establishing the first connection configuration and wherein when in the first connection configuration, a block of pins of the reconfigurable FPGA are configured to communicate over a PCI express connection and when in the second connection configuration, the block of pins of the reconfigurable FPGA are configured to communicate over an Ethernet connection; and
    wherein the BMC is configured to represent itself to the host computing device as a plurality of emulated computing devices, each of the emulated computing devices implemented by a different emulation module of the BMC, the emulation modules configured to share a connection to the system bus, and at least one of the emulation modules configured to represent itself as a network connection, to provide information about the network connection to the system bus, and to provide access to one or more of the emulated computing devices using the network connection such that an actual path and an emulated path of a request from the host computing device to the one or more of the emulated computing devices using the network connection are indistinguishable to the host computing device.

2. The BMC of claim 1, further comprising a network module communicatively connecting the BMC with one or more networks.

3. The BMC of claim 2, further comprising a management module communicating first management transactions over the one or more networks wherein one or more of the networks is a management network exclusively used for second management transactions.

4. The BMC of claim 2, wherein the BMC receives power to operate hardware of the BMC through a network connection to the network module.

5. The BMC of claim 1, further comprising a second monitor module, the second monitor module receiving the operations parameters from the monitor module and providing a user with a notification of the operations parameters that are outside pre-established thresholds.

6. The BMC of claim 1, further comprising one or more boot device emulation modules, each boot device emulation module providing a bit stream to an associated computing element within the host computing device wherein each of the one or more boot device emulation modules represents itself as a boot device for the associated computing element and the bit streams provide for boot operation of the associated computing element.

7. The BMC of claim 6, wherein the bit stream is one of a plurality of stored bit streams having an associated compatibility profile, each boot device emulation module determining a configuration profile of the host computing device and providing to the associated computing element one bit stream having the associated compatibility profile consistent with the configuration profile of the host computing device.

8. The BMC of claim 1, further comprising a security module, the security module executing one or more of:
    validating control messages and management messages sent to the BMC;
    setting one or more host computing devices in a state compatible with system security requirements for one or more computing devices communicating with the host computing device; and
    validating software and firmware code for the BMC and the one or more host computing devices.

9. The BMC of claim 1, further comprising an interrupt module configured to generate an interrupt message for transmission to one or more computing devices, and to receive an interrupt message from one or more computing devices, wherein the computing device is one of a local computing device and a remote computing device.

10. The BMC of claim 1, further comprising a logging module configured to store as data elements in non-volatile memory one or more of the operations parameters of the host computing device, recovery parameters, manufacturing parameters, security events, and environmental events, the logging module further assigning to each data element a storage classification defining permissions and storage characteristics.

11. The BMC of claim 2, further comprising an assignment module comprising:
   a subtask module configured to divide a management task into a plurality of subtasks;
   a delegation module configured to assign an execution order for the subtasks and to assign the subtasks to one or more BMCs communicatively connected to the BMC over the one or more networks;
   a master module configured to receive response data from the one or more BMCs that received the subtasks from the delegation module; and
   a subtask module configured to receive subtasks from a subtask-initiating BMC on the one or more networks, execute the received subtasks, and return response data to the subtask-initiating BMC.

12. The BMC of claim 1, further comprising an environmental control module configured to control power settings and temperature settings of the host computing device, wherein controlling comprises monitoring a temperature of the host computing device and adjusting one or more of the settings to put an environment of the host computing device in an environmental profile.

13. The BMC of claim 1, further comprising a system test module configured to execute one or more systems tests, the systems tests comprising one or more of a power on self test (POST), a diagnostics test, qualification test, and an acceptance test.

14. The BMC of claim 1, further comprising a scan ring module configured to transfer data between the BMC and one or more devices on the host computing device supporting scan ring access.

15. The BMC of claim 1, further comprising a code load module configured to request code from one of a local host computing device and an external device and store the code locally on the BMC.

16. The BMC of claim 15, wherein the BMC utilizes the code load module to boot itself from one of the local host computing device and the external device.

17. The BMC of claim 1, further comprising a programmable read only memory (PROM) having one or more boot images for the BMC, including one or more known good boot images, the BMC further comprising a boot module configured to load the known good boot image to the BMC after a failed load of the one or more boot images to the BMC.

18. The BMC of claim 17, further comprising an update module configured to store a current image in use on the BMC into the non-volatile memory in response to a command to load a new image to the BMC, the update module further configured to restore the current image from the non-volatile memory to the BMC in response to a failure in the new image.

19. The BMC of claim 2, further comprising a network boot module facilitating a network boot of the host computing device, the network boot module supplying network configuration information to the host computing device.

20. A system comprising:
   one or more host computing devices comprising one or more computing elements connected to a system bus, each host computing device being configured to receive a baseboard management controller (BMC);
   one or more BMCs comprising:
   a reconfigurable field programmable gate array (FPGA) comprising a monitor module configured to monitor one or more operations parameters of the host computing device, the monitor module configured to be operationally independent of the host computing device;
   a host connector configured to communicatively connect the BMC to the system bus of the host computing device, the system bus configured to provide connectivity between the one or more computing elements of the host computing device, the host connector further comprising a plurality of functionally reconfigurable pins, wherein a connection configuration of the functionally reconfigurable pins is established by the FPGA; and
   a server module comprising a processor, non-volatile memory, and an operating system, the operating system configured to provide services of one or more modules to the host computing device, the server module configured to be operationally independent of the host computing device; and
   a network module configured to communicatively connect the BMC with one or more networks;
   wherein the host connector is configured to implement a plurality of different connection configurations based on logic programming of the FPGA, a particular connection configuration of the plurality corresponding to a communication protocol used by the system bus of the host computing device;
   wherein the reconfigurable FPGA is configured to establish a first connection configuration of the plurality of different connection configurations and is configured to establish a second connection configuration of the plurality of connection configurations subsequent to establishing the first connection configuration and wherein when in the first connection configuration, a block of pins of the reconfigurable FPGA are configured to communicate over a PCI express connection and when in the second connection configuration, the block of pins of the reconfigurable FPGA are configured to communicate over an Ethernet connection;
   wherein the BMC is configured to represent itself to the host computing device as a plurality of emulated computing devices, each of the emulated computing devices implemented by a different emulation module of the BMC, the emulation modules configured to share a connection to the system bus, and at least one of the emulation modules configured to represent itself as a network connection, to provide information about the network connection to the system bus, and to provide access to one or more of the emulated computing devices using the network connection such that an actual path and an emulated path of a request from the host computing device to the one or more of the emulated computing devices using the network connection are indistinguishable to the host computing device; and
   one or more networks communicatively connecting the one or more BMCs.

21. The system of claim 20, further comprising one or more boot device emulation modules, each boot device emulation module providing a bit stream to an associated computing element within the host computing device.

22. The system of claim 21, wherein the bit stream is one of a plurality of stored bit streams having an associated compatibility profile, each boot device emulation module determining a configuration profile of the host computing device and providing to the associated computing element one bit stream having the associated compatibility profile consistent with the configuration profile of the host computing device.

23. A baseboard management controller module (BMC) comprising:
- a reconfigurable field programmable gate array (FPGA) comprising a monitor module configured to monitor one or more operations parameters of a host computing device, the monitor module configured to be operationally independent of the host computing device;
- a host connector configured to communicatively connect the BMC to a system bus of the host computing device, the system bus configured to provide connectivity between one or more computing elements of the host computing device, the host connector further comprising a plurality of functionally reconfigurable pins, wherein a connection configuration of the functionally reconfigurable pins is established by the FPGA;
- a server module comprising a processor, non-volatile memory, and an operating system, the operating system configured to provide services of one or more modules to the host computing device, the server module configured to be operationally independent of the host computing device;
- wherein the reconfigurable FPGA is configured to establish a plurality of connection configurations of the functionally reconfigurable pins of the host connector, a different one of the connection configurations being established for each of a plurality of different communications protocols, one of the communications protocols being used by the system bus of the host computing device;
- wherein the reconfigurable FPGA is configured to establish a first connection configuration of the plurality of different connection configurations and is configured to establish a second connection configuration of the plurality of connection configurations subsequent to establishing the first connection configuration and wherein when in the first connection configuration, a block of pins of the reconfigurable FPGA are configured to communicate over a PCI express connection and when in the second connection configuration, the block of pins of the reconfigurable FPGA are configured to communicate over an Ethernet connection;
- wherein the BMC is configured to represent itself to the host computing device as a plurality of emulated computing devices, each of the emulated computing devices implemented by a different emulation module of the BMC, the emulation modules configured to share a connection to the system bus, and at least one of the emulation modules configured to represent itself as a network connection, to provide information about the network connection to the system bus, and to provide access to one or more of the emulated computing devices using the network connection such that an actual path and an emulated path of a request from the host computing device to the one or more of the emulated computing devices using the network connection are indistinguishable to the host computing device; and
- further comprising one or more boot device emulation modules, each boot device emulation module configured to provide a bit stream to an associated computing element within the host computing device wherein each of the one or more boot device emulation modules is configured to represent itself as a boot device for the associated computing element and the bit streams provide for boot operation of the associated computing element.

\* \* \* \* \*